(12) United States Patent
Norman (10) Patent No.: US 7,068,511 B1
(45) Date of Patent: Jun. 27, 2006

(54) HIGH-DENSITY ARCHITECTURE FOR A MICROELECTRONIC COMPLEX ON A PLANAR BODY

(75) Inventor: Richard S. Norman, 1877 Poissant Road, Sutton, Quebec (CA) J0E 2K0

(73) Assignee: Richard S. Norman, Sutton (CA)

( * ) Notice: Subject to any disclaimer, the term of this patent is extended or adjusted under 35 U.S.C. 154(b) by 391 days.

(21) Appl. No.: 10/330,319

(22) Filed: Dec. 30, 2002

Related U.S. Application Data (60) Provisional application No. 60/343,244, filed on Dec. 31, 2001.

(51) Int. Cl.
*H05K 7/20* (2006.01)

(52) U.S. Cl. ............ 361/704; 165/80.3; 165/185; 257/712; 257/713; 361/708; 361/710; 361/719

(58) Field of Classification Search ........... 165/80.2, 165/80.3, 185; 257/706–707, 712–713, 718–719, 257/618–620; 361/704–721
See application file for complete search history.

(56) References Cited

U.S. PATENT DOCUMENTS

| | | | |
|---|---|---|---|
| 3,999,105 A | | 12/1976 | Archey et al. |
| 4,764,846 A | * | 8/1988 | Go .......................... 361/708 |
| 5,691,949 A | | 11/1997 | Hively et al. |
| 5,726,492 A | * | 3/1998 | Suzuki et al. ............. 257/685 |
| 6,184,066 B1 | * | 2/2001 | Chino et al. ............... 438/118 |

* cited by examiner

*Primary Examiner*—Gregory Thompson (57) ABSTRACT

A microelectronic complex including a first body, a discrete functional module and an interconnection module. The first body is characterized by a planar main surface that defines an attachment site. The discrete functional module includes a second body containing an integrated circuit, the second body characterized by a pair of main faces and a side surface between the pair of main faces. The discrete functional module is affixed to the first body at the attachment site, such that the first and second bodies are maintained in a predetermined spatial relationship in which the side surface of the second body faces the planar main surface of the first body. The interconnection module allows signals to be transported between the first body and the integrated circuit of the second body.

15 Claims, 8 Drawing Sheets

HIGH-DENSITY ARCHITECTURE FOR A MICROELECTRONIC COMPLEX ON A PLANAR BODY

CROSS-REFERENCE TO RELATED APPLICATION

The above-referenced application is based on U.S. provisional patent application No. 60/343,244, filed on Dec. 31, 2001, having the same inventor.

FIELD OF THE INVENTION

The invention relates to the field of microelectronic complexes on planar bodies, such as Printed Circuit Boards (PCBs), Multi-Chip Modules (MCMs) and silicon wafers. More specifically, the invention is directed to a high-density architecture for a microelectronic complex on a planar body.

BACKGROUND OF THE INVENTION

The evolution of integrated circuit (IC) fabrication technology has made possible the fabrication of microelectronic complexes, which perform a wide variety of functions and are characterized by varying degrees of complexity. Microelectronic complexes, that is systems and groups of discrete microelectronic functional modules, implement an important range of electronic devices, including microcomputers and microprocessors, and have important application in the design of electronic systems. Examples of such microelectronic complexes include PCBs, MCMs and semiconductor wafers for Wafer-Scale Integration (WSI) applications or "silicon circuit boards", containing a plurality of chips and/or integrated circuits.

In the case of a silicon wafer, the wafer is typically divided into a plurality of discrete functional cells. These cells are laid out within a dedicated area on the wafer surface, typically forming a grid-like array, such that a finished silicon wafer may contain from 100 to 1000 finished cells. Once packaged, the wafer may include hundreds, if not thousands, of connectors, pins and wires, among other possibilities, for external connection to a circuit board, permitting signals to be exchanged between the circuits/chips and the circuit board.

A problem commonly faced during the design and fabrication of microelectronic complexes on silicon wafers is the restricted amount of surface area available on the planar interconnect medium of the wafer, within which confines the microelectronic complex must be built. Even with the development of new fabrication technologies that permit an increased density of integrated circuits per wafer, the larger, more complex arrangements of microelectronic functional modules become infeasible for fabrication on a single wafer, which typically provides a single, two-dimensional interconnect plane.

Furthermore, as the microelectronic complexes formed on a silicon wafer become larger and we see an increased density of integrated circuits per wafer, the heat dissipation requirement per wafer increases proportionally. More specifically, the requirement for efficient and maximized heat dissipation from the wafer becomes extremely important, in order to prevent over-heating and subsequent malfunctioning or failure of, as well as possible damage to, the functional cells of the wafer.

Existing solutions to the problem of limited circuit density per silicon wafer include the mounting of chips directly onto the active surface of the silicon wafer, as well as the attachment of printed circuit boards to the silicon wafer. Although both solutions provide for increased density per wafer, this density is still limited as the circuitry continues to be restricted to the interconnect plane of the wafer.

The above-described problem extends to most microelectronic complexes formed on planar bodies, including PCBs and MCMs, among other possibilities. Unfortunately, the circuit density and the cooling capacity of a microelectronic complex are both limited when the microelectronic complex is restricted to a two-dimensional interconnect plane.

Against this background, it clearly appears that a need exists in the industry for a novel high-density architecture for a microelectronic complex on a planar body.

SUMMARY OF THE INVENTION

According to a broad aspect, the invention provides a microelectronic complex including a first body, a discrete functional module and an interconnection module. The first body is characterized by a planar main surface that defines an attachment site. The discrete functional module includes a second body containing an integrated circuit, the second body characterized by a pair of main faces and a side surface between the pair of main faces. The discrete functional module is affixed to the first body at the attachment site, such that the first and second bodies are maintained in a predetermined spatial relationship in which the side surface of the second body faces the planar main surface of the first body. The interconnection module allows signals to be transported between the first body and the integrated circuit of the second body.

Advantageously, the microelectronic complex according to the present invention provides the possibility for increased density of integrated circuits per microelectronic complex. The increase in density is provided by the affixing of at least one self-contained functional module to the planar main body of the microelectronic complex, which increases the surface area and possibly the complexity of the microelectronic complex. The functional module, which is formed on a separate body of material, is maintained in a predetermined spatial relationship with the main body of the microelectronic complex. As such, the functional module may serve to radiate heat generated by the microelectronic complex on the main semiconductor body to the surrounding ambient.

In a specific example of implementation, the microelectronic complex is formed of a semiconductor wafer including multiple discrete functional modules affixed thereto. The functional modules are maintained in a predetermined spatial relationship with the body of the wafer. In particular, the functional modules are arranged side by side in a row on the main surface of the wafer body, and share a common finger-like shape.

Each functional module is designed to perform a particular function or to implement a particular process within the microelectronic complex. Accordingly, each functional module may itself contain a plurality of discrete functional sub-modules, each discrete functional sub-module including at least one integrated circuit. Alternatively, the functional module may contain a single discrete functional sub-module, formed of one or more integrated circuits.

A functional module is formed of a body of semiconductor material that includes a pair of main faces, as well as four side surfaces located between the main faces. The functional modules are affixed to the wafer body such that, for each functional module, a designated side surface faces the main surface of the wafer body.

On the basis of the spatial relationship that is maintained between the functional modules and the wafer body, the functional modules may realize a cooling system for the microelectronic complex. This cooling system includes a plurality of cooling fins, each cooling fin formed by a functional module. In the role of cooling fin, the body of a functional module is operative to increase the cooling capacity of the microelectronic complex, responsible for transmitting or off-loading heat generated by the wafer body to the ambient environment.

According to another broad aspect, the invention provides a method for fabricating a microelectronic complex.

BRIEF DESCRIPTION OF THE DRAWINGS

These and other features of the present invention will become apparent from the following detailed description considered in connection with the accompanying drawings, of which.

In the drawings, embodiments of the invention are illustrated by way of example. It is to be expressly understood, however, that the drawings are provided only for purposes of illustration and as an aid to understanding, and are not intended to be a definition of the limits of the invention, for which reference should be made to the appending claims.

DETAILED DESCRIPTION

Figure 1:
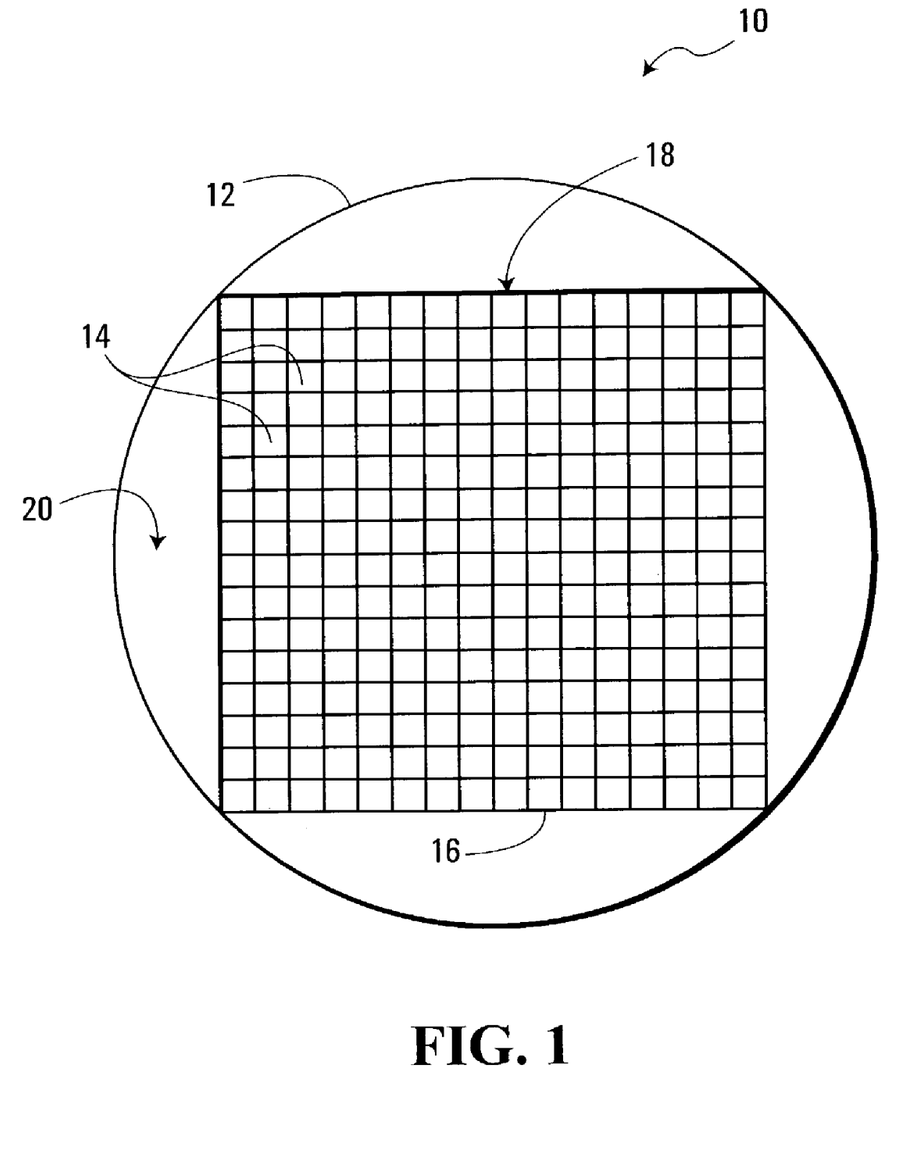
FIG. 1 is a top view of an example of a semiconductor wafer.

FIG. 1 is a top view of a semiconductor wafer 10, one example of a typical microelectronic complex. The wafer 10 is formed of a planar body of semiconductor material 12 and contains a plurality of discrete functional modules 14, also referred to as cells. In this particular example of a microelectronic complex, each discrete functional module 14 includes at least one integrated circuit.

Note that in other examples of microelectronic complexes, such as the integrated circuit itself, the discrete functional modules of the microelectronic complex include the electronic components of the integrated circuit. Further, although the following example of implementation describes a microelectronic complex formed on a semiconductor wafer, the present invention is generally applicable to all microelectronic complexes formed on planar bodies or substrates, or on bodies/substrates defining at least one planar surface, where these bodies/substrates may be of various types of materials.

The wafer body of semiconductor material 12 is made of any suitable material that has the requisite electrical properties and mechanical strength, such as silicon, germanium or gallium arsenide, and may be of any size or shape. In the example of FIG. 1, the semiconductor material of wafer body 12 is silicon, the body 12 characterized by a circular shape as a result of the cylindrical shape of the silicon crystal from which the wafer 10 was sliced. Typically, body 12 would be 10 to 30 cm in diameter and less than 1 mm thick.

The methods and techniques used to form integrated circuits in the material of body 12, such as oxidation, diffusion, ion implantation and chemical vapor deposition, have been well documented and are well known in the art. As such, these methods and techniques will not be described in further detail.

The cells 14 of the wafer 10 are dispersed within a dedicated area 16 of the body 12. Alternatively, the cells 14 may be dispersed across the entire surface area of body 12. In the example of FIG. 1, the cells 14 are laid out in a structured array 18, where the cells 14 are all adjacent one another and each cell 14 is of the same size and occupies substantially the same amount of space. Alternatively, the cells 14 could be spaced apart from each other within the array 18, and could be of different sizes and occupy different amounts of space.

The wafer 10 has first and second planar surfaces, where the first planar surface 20, also referred to as the main surface, is shown in FIG. 1. Although not shown in FIG. 1, a plurality of Input/Output (I/O) signal conducting members are mounted on the first surface 20 for connection to an external substrate, such as a circuit board. Examples of signal conducting members include connectors, pins and wires, among other possibilities. These signal conducting members are characterized by a high level of conductivity for transmitting signals between the discrete functional modules 14 of the wafer 10 and the external substrate, where such signals may include electrical and/or optical signals.

In a specific example of implementation, the wafer 10 is constructed using flip-chip technology, and solder balls or bumps are formed on the surface 20 of wafer 10, for receiving the I/O signal conducting members. The concept of flip-chip technology is well known to those skilled in the art, has been well documented and, as such, will not be described in further detail. Alternatively, the signal conducting members may be mounted to the second surface (not shown in FIG. 1) of the wafer 10.

Figure 2:
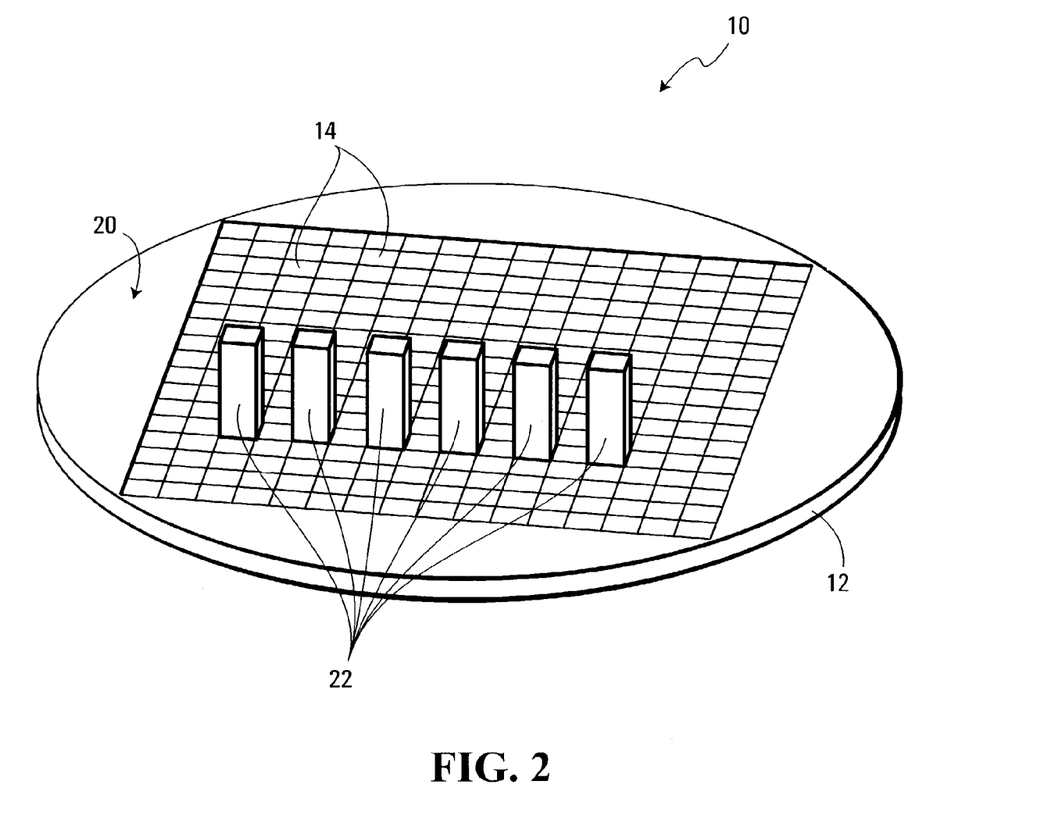
FIG. 2 is a perspective view of a semiconductor wafer including a plurality of discrete processing modules, according to an example of implementation of the present invention.

Specific to the present invention, the planar main surface 20 of the wafer 10 includes attachment sites (not shown) for receiving multiple discrete functional modules 22. Each functional module 22 is affixed to the body 12 at a designated attachment site, as shown in the perspective view of FIG. 2. The functional modules 22 are maintained in a predetermined spatial relationship with the body 12 of the wafer 10, as will be discussed in further detail below. In the example of FIG. 2, the functional modules 22 are arranged side by side in a row on the main surface 20 of the wafer 10, and share a common finger-like shape.

Note that the wafer 10 may include any number of functional modules 22, including only one, and that these functional modules 22 may be arranged in various orderly arrangements, or alternatively may be randomly dispersed, on the surface 20 of the wafer 10. Further, the functional modules 22 may be characterized by various shapes and sizes.

Each functional module 22 is designed to perform a particular function or to implement a particular process within the microelectronic complex of wafer 10. In a specific example, a functional module 22 receives/transmits optical signals from/to an external entity. Accordingly, the functional module 22 would include an optical transceiver for coupling to a plurality of optical fibers connecting the functional module 22 to the external entity, as well as an application-specific integrated circuit (ASIC) for processing, and possibly generating, the optical signals. In another specific example, a functional module 22 includes one or more processors, as well as standard functional sub-modules, such as SRAM and DRAM, for performing standard processing operations within the microelectronic complex.

Note that, in a high-density architecture such as that shown in FIG. 2, the microelectronic complex should include high-performance data buses formed on the wafer 10. These data buses serve to interconnect the discrete functional modules 22 and the cells 14 of the wafer 10, and allow the transfer of data between connected modules 22 and cells 14. For more information on such a high-performance data bus, please refer to co-pending U.S. patent application Ser. No. 10/330,230 entitled "Reference Wires for an Electrical Bus", in the name of Richard Norman, filed on the same date as the present application and incorporated by reference herein.

Figure 3:
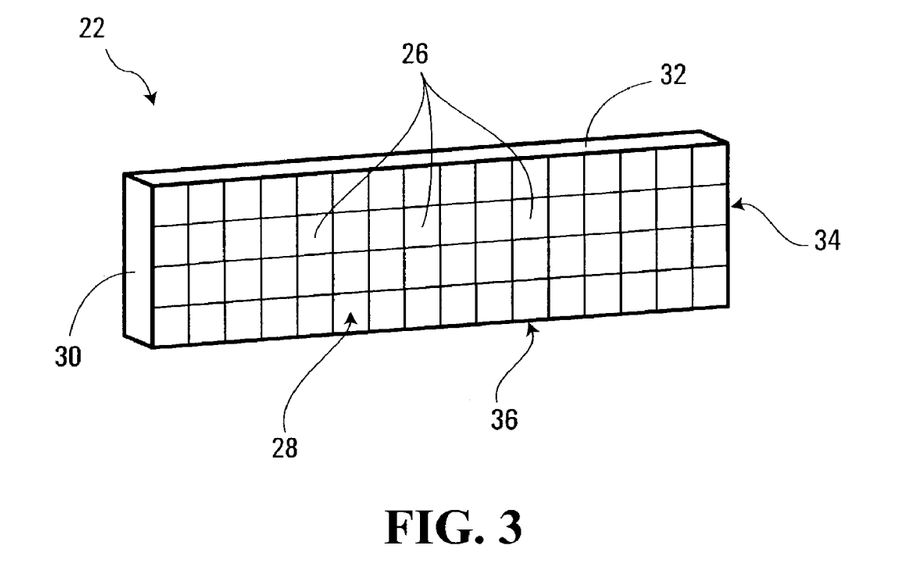
FIG. 3 is a front perspective view of a discrete processing module shown in FIG. 2.
Figure 4:
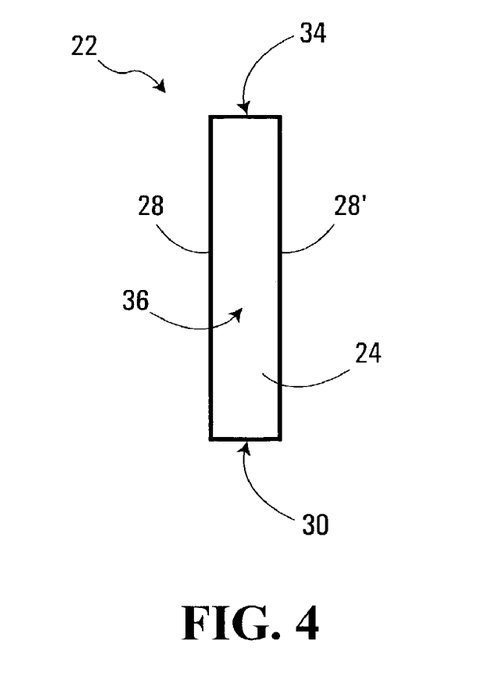
FIG. 4 is a side view of the discrete processing module shown in FIG. 3.

As seen in FIGS. 3 and 4, a functional module 22 is formed of a body 24 of heat-conductive material, which includes a pair of main faces 28 and 28', as well as four side surfaces 30, 32, 34 and 36 located between the main faces 28, 28'.

The functional modules 22 are affixed to the body 12 of wafer 10 at the designated attachment site such that, for each functional module 22, the side surface 30 of the body 24 faces the main surface 20 of body 12. In the example of FIG. 2, the side surface 30 of each functional module 22 is in contact with the main surface 20 of body 12 at an attachment site. Alternatively, the functional modules 22 may be spaced apart from the main surface 20 of the body 12, such that the side surfaces 30 of the functional modules 22 face, but are not in direct contact with, the surface 20 of body 12.

Note that, in a specific example, the functional modules 22 may be affixed to the body 12 of wafer 10 such that, for each functional module 22, any one of the other three side surfaces 32, 34 and 36 of body 24 faces the main surface 18 of body 12.

The body 24 of each functional module 22 contains a plurality of discrete functional sub-modules 26, each discrete functional sub-module 26 including at least one integrated circuit. Alternatively, the functional module 22 may contain a single discrete functional sub-module 26, formed of one or more integrated circuits.

In a specific example, the body 24 each functional module 22 is a substrate onto which are mounted a plurality of semi-conductor chips, each chip including at least one integrated circuit. The substrate 24 is formed of any suitable dielectric, heat-conductive material.

In another specific example, the body 24 of each functional module 22 is formed of semi-conductor material, such as silicon, and contains one or more integrated circuits. Note that integrated circuits may be formed in the semiconductor material of body 24 using the same methods and techniques as those used on the body 12 of wafer 10.

The side surface 30 of a functional module 22, and thus its footprint on the surface 20 of body 12, is characterized by a very small surface area, in order to compensate for any potential difference in thermal expansion between the material of the functional module 22 and the material of the wafer 10. Thermal expansion effects, which are well known in the art and as such will not be discussed in further detail, may damage the connection(s) between the functional module 22 and the wafer 10.

Thus, the surface area over which the functional module 22 and the wafer 10 are connected should be small enough to ensure that, under normal operating conditions, any thermal expansion effects arising within that surface area will typically be insufficient to cause any breakage between the functional module 22 and the wafer 10. In a specific example of implementation, the surface area of side surface 30 is no greater than 900 mm$^2$, which is comparable to the surface area of a chip manufactured using today's standard chip packaging technology.

Figure 5:
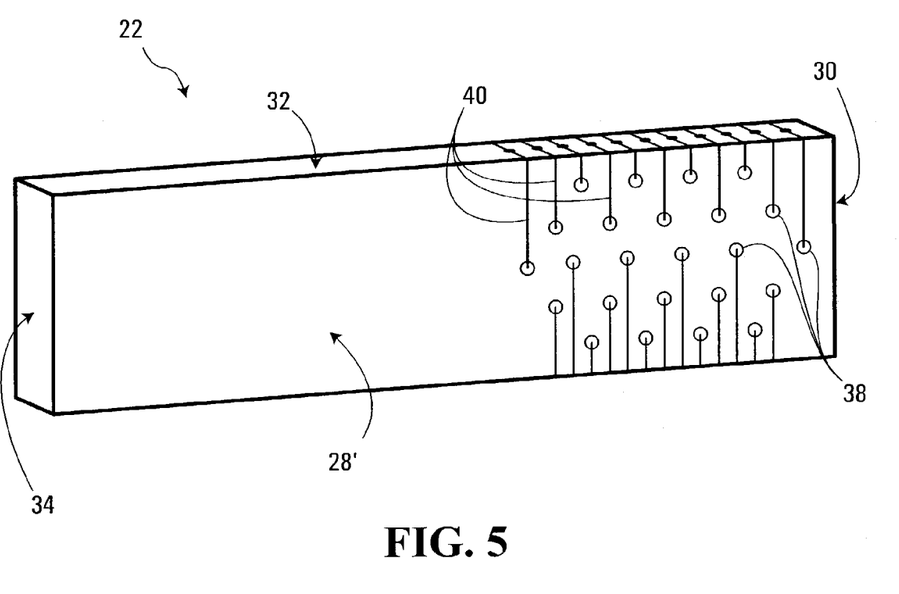
FIG. 5 is a rear perspective view of the discrete processing module shown in FIG. 3.
Figure 6:
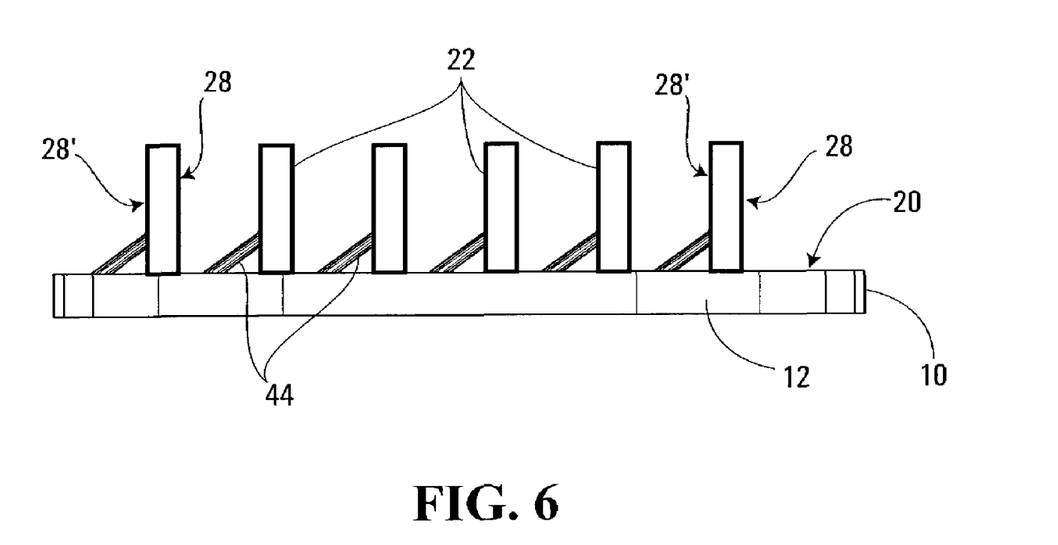
FIG. 6 is a side view of the semiconductor wafer shown in FIG. 2.

As seen in FIG. 5, on the main face 28' of the body 24 of each functional module 22 are mounted a plurality of contact pads 38. These contact pads 38 are adapted to receive signal conducting members (not shown) for connection to the body 12 of wafer 10. Each contact pad 38 is associated with a discrete functional sub-module 26 of the respective functional module 22, where several contact pads 38 may be associated with different components of the same functional sub-module 26. Fine wires 40 are mounted to additional pads mounted around the perimeter of the body 24. These tiny wires 40 are bonded to the contact pads 38 on the main face 28', and interconnect the points of connection of functional sub-modules 26 on the main face 28 to the contact pads 38.

Alternatively, the body 24 may be constructed using a technology similar to wafer flip-chip technology, in which case the contact pads 38 are solder balls or bumps positioned on the main face 28 of the body 24. In this case, fine wires 40 would not be required to wrap around the body 24, from main face 28 to main face 28'. The concept of flip-chip technology is well known to those skilled in the art, has been well documented and, as such, will not be described in further detail.

Thus, the contact pads 38 located on one of the main faces 28, 28' of a particular functional module 22 allow signals to be exchanged between the particular functional module 22 and the discrete functional modules 14 of the body 12, via the signal conducting members.

In order to attach or affix a functional module 22 to the wafer 10, more specifically the side surface 30 of body 24 of functional module 22 to the main surface 18 of body 12 of wafer 10, several different techniques may be used. In a specific example, the functional modules 22 are surface mounted to the body 12 using standard solder or thermoset (thermally conductive adhesive or gel) anchoring techniques. Alternatively, the functional modules 22 may be attached using one or more mechanical attachment devices, such as a clamp, adhesive or screws. In another alternative, each functional module 22 is received in, and frictionally engaged by, a corresponding receptacle formed in the body 12 of wafer 10.

The affixing of functional modules 22 to the body 12 of wafer 10 ensures that these functional modules 22 are maintained in a spatial relationship with the wafer 10. Specific to the non-limiting example of implementation shown in FIG. 2, the finger-like functional modules 22 are mounted on the body 12 of wafer 10 such that they are substantially perpendicular to the planar surface 20 of body 12. As shown in the side view of FIG. 7, the main faces 28, 28' of each functional module 22 form a right angle with the surface 20 of body 12.

Figure 7:
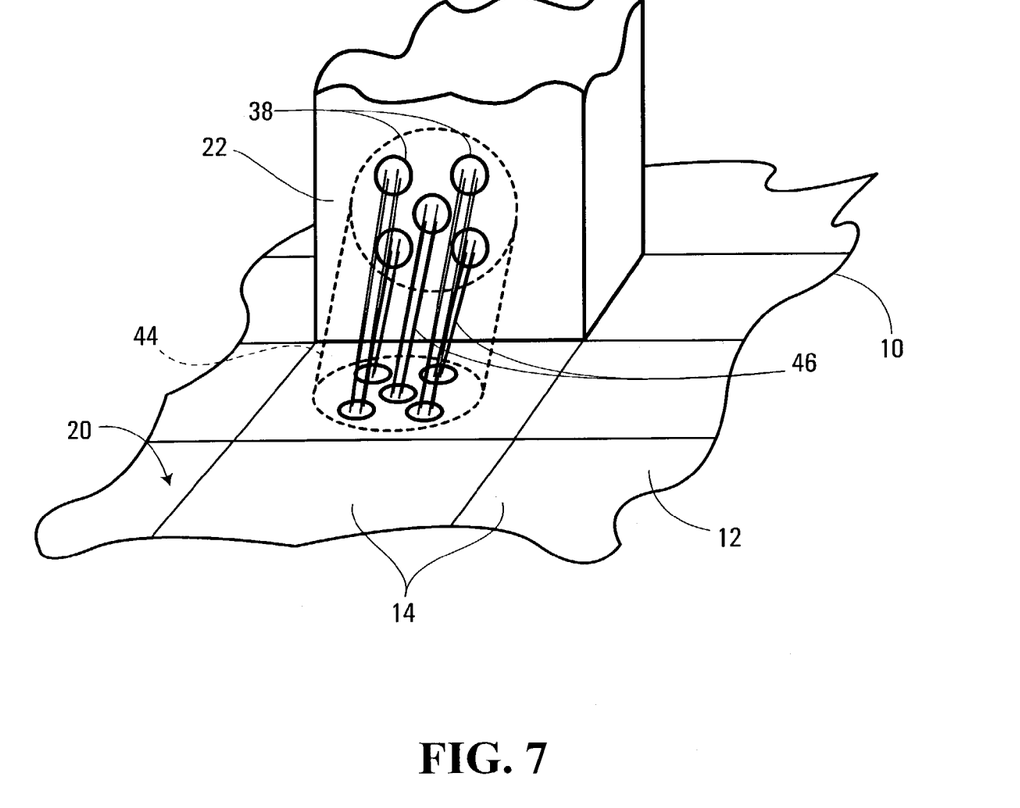
FIG. 7 illustrates an interconnection module connecting a processing module to the wafer shown in FIG. 2.

For each functional module 22 affixed to wafer 10, there is provided an interconnection module 44 containing a plurality of signal conducting members for conveying signals between the contact pads 38 on main face 28' of the functional module 22 and the body 12 of wafer 10. The body of this interconnection module 44 is formed of any suitable dielectric material, such as plastic.

Figure 8:
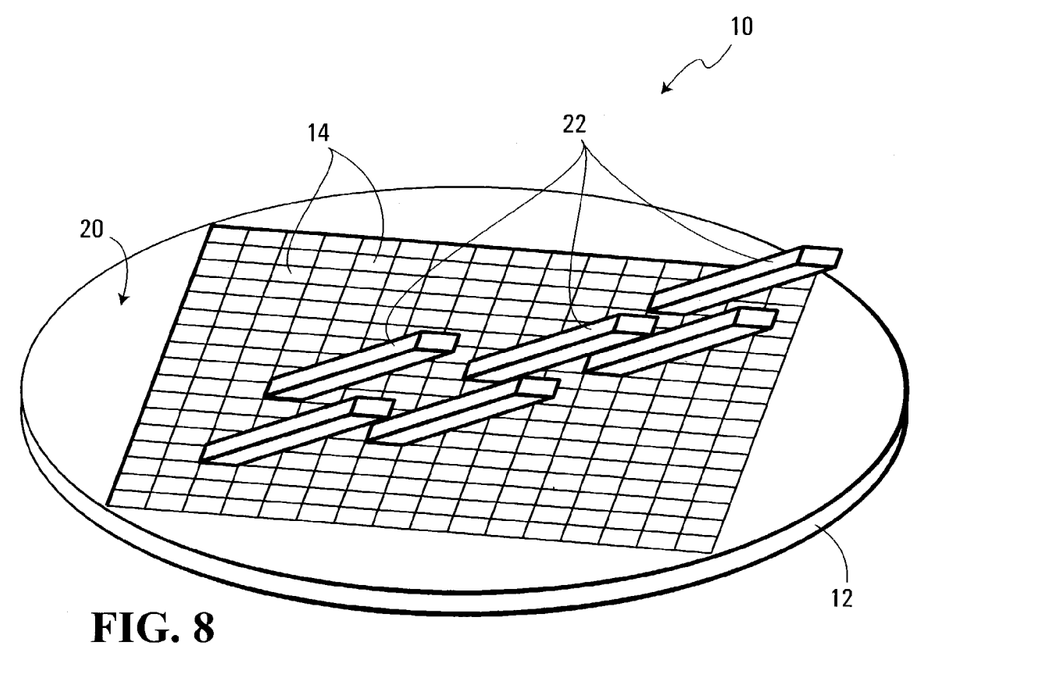
FIG. 8 is a perspective view a semiconductor wafer including a plurality of discrete processing modules, according to a variant example of implementation of the present invention.

In the example of implementation shown in FIGS. 1–7, each interconnection module 44 is a right-angle connector containing a plurality of signal transmissive pathways 46, as shown in the close up view of FIG. 8. The term "right-angle" refers to the fact that connectors 44 are designed to interconnect bodies that are perpendicular with respect to each other, as in the case of bodies 12 and 24. Each signal transmissive pathway 46 of a connector 44 connects a contact pad 38 of the respective functional module 22 to a corresponding contact pad on the surface 20 of wafer body 12. Thus, the signal transmissive pathways 46 of a connector 44 convey signals between the respective functional module 22 and one or more discrete functional modules 14 on wafer body 12.

Note that the signal transmissive pathways 46 can be electrically conductive pathways that are capable of transporting electrical signals between the functional module 22 and the wafer 10. Alternatively, the signal transmissive pathways 46 can be optical fibers for transmitting optical signals.

In this specific example of implementation, the connectors 44 used to interconnect the discrete functional modules 22 and the wafer 10 are implemented on the basis of the connector described in the co-pending U.S. patent application Ser. No. 10/330,232 entitled "A connector for transporting signals between contact pads on two surfaces", in the name of Richard Norman, filed on the same date as the present application and incorporated by reference herein. Accordingly, each connector 44 is formed of a continuous sheet of material that includes a plurality of densely packed signal transmissive pathways 46 formed in a side-by-side relationship on the surface of the sheet of material. A connector 44 is formed by rolling the continuous sheet of material, including the signal transmissive pathways 46, into a cylinder that has a plurality of coils forming a series of superposed layers. Signal transmissive pathways 46 are exposed at both terminal ends of the connector 44. In this manner, when external devices, such as a functional module 22 and wafer 10, are connected to the terminal ends of connector 44, the contact pads of the external devices are able to mate with the exposed signal transmissive pathways, and exchange signals with each other through the signal transmissive pathways.

It is possible that the sheet of material used to form the connector 44 is made of a flexible material that is able to expand and contract such that the distance separating respective signal transmissive pathways 46 is also able to expand and contract. Such a feature is particularly desirable in order to compensate for thermal expansion mismatch between the materials of the discrete functional modules 22 and the wafer 10.

In one example of implementation, a connector 44 is formed of a sheet of flexible, electrically insulating material such as Kapton® onto which are formed, by known printing techniques, a series of copper signal transmission pathways 46. Under a second possibility, signal transmissive pathways 46 include optical pathways, such as optical fibers for carrying optical signals. The optical pathways can be integrated into the flexible material using known techniques. Under this second possibility, the sheet of material from which connector 44 is formed does not need to be made of an electrically insulating material, and can instead be made of any material that is appropriate for supporting and maintaining the optical signal conductive pathways in a predetermined spatial relationship.

Alternatively, various types and designs of interconnection modules 44 can be used to interconnect the functional modules 22 and the body 12 of wafer 10, without departing from the scope of the present invention.

On the basis of the spatial relationship that is maintained between the functional modules 22 and the body 12 of wafer 10, the functional modules 22 may realize a cooling system for the microelectronic complex that is formed by wafer 10 and functional modules 22. This cooling system includes a plurality of cooling fins, each functional module 22 forming one cooling fin of the cooling system. In the role of cooling fin, the body 24 of a functional module 22 is operative to increase the cooling capacity of the microelectronic complex.

More particularly, the functional modules 22 are thermally coupled to the body 12, such that heat generated by the discrete functional modules 14 of the body 12 is conducted from the body 12 to the bodies 24 of functional modules 22. The heat generated by the body 12 is conducted from the body 12 to the functional modules 22 via the contact established between surface 20 of body 12 and the surface 30 of each functional module 22. The heat will then move through the heat-conductive bodies 24 of functional modules 22, which will then transmit the heat to the ambient environment.

Note that if a particular functional module 22 itself generates an excessive amount of heat, its ability to act as a cooling fin of the cooling system, and thus to increase the cooling capacity of the microelectronic complex, will diminish.

Figure 9:
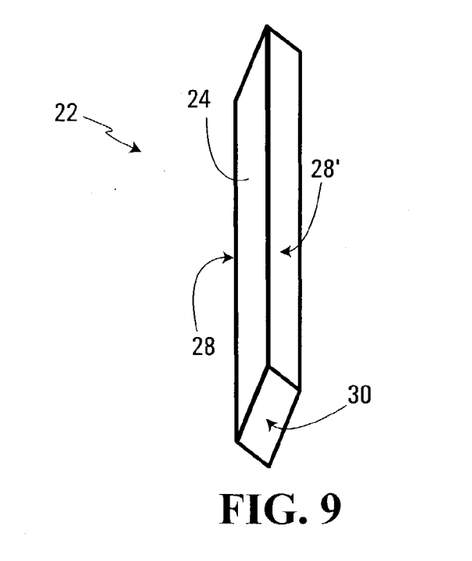
FIG. 9 is a side perspective view of a processing module shown in FIG. 8.

In a variant example of implementation, functional modules 22 are designed such that, once affixed to the surface 20 of wafer 10, a different predetermined spatial relationship is defined between the functional modules 22 and the wafer 10. With reference to FIGS. 8 and 9, the body 24 of each functional module is constructed such that the side surface 30 is angled between main faces 28, 28'. Accordingly, once the side surface 30 of functional module 22 has been affixed to the surface 20 of body 12, the main face 28 of functional module 22 forms an obtuse angle with the surface 20, while main face 28' forms a complementary acute angle with the surface 20. Note that, alternatively, the body 24 of functional module could be constructed such that the main face 28 forms an acute angle with the surface 20, while main face 28' forms a complementary obtuse angle with the surface 20. Thus, should the microelectronic complex formed by wafer 10 and functional modules 22 have to comply with certain predetermined height requirements, the functional modules 22 may be angled with respect to the surface 20 of wafer 10.

Figure 10:
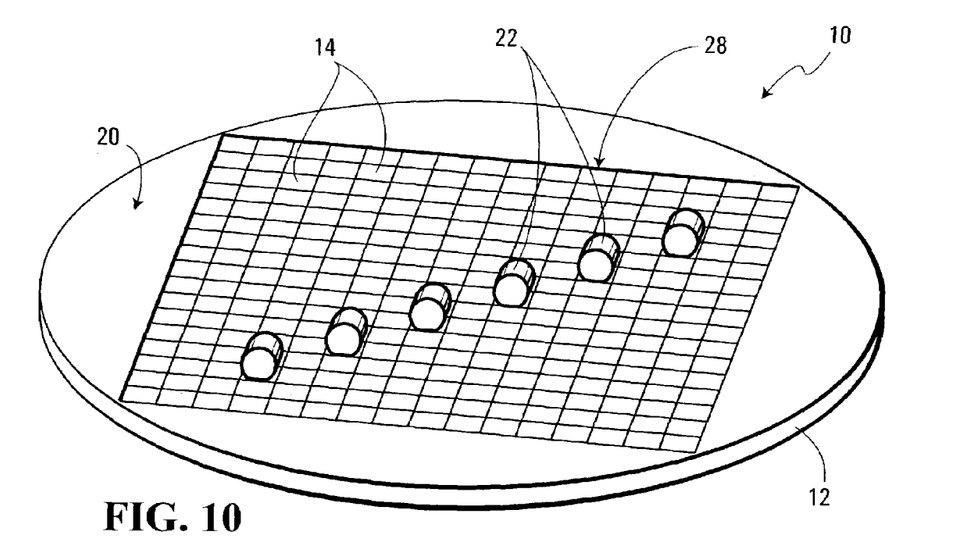
FIG. 10 is a perspective view a semiconductor wafer including a plurality of discrete processing modules, according to another variant example of implementation of the present invention.

In another variant example of implementation, the bodies 24 of functional modules 22 are constructed such that the functional modules 22 are characterized by a different shape. With reference to FIG. 10, functional modules 22 share a common circular shape. In this example, for each functional module 22, the side surface intended for affixing to the surface 20 of body 12 defines a transverse dimension that is smaller than the largest diameter of the substantially circular surface area of main face 28.

Figure 11:
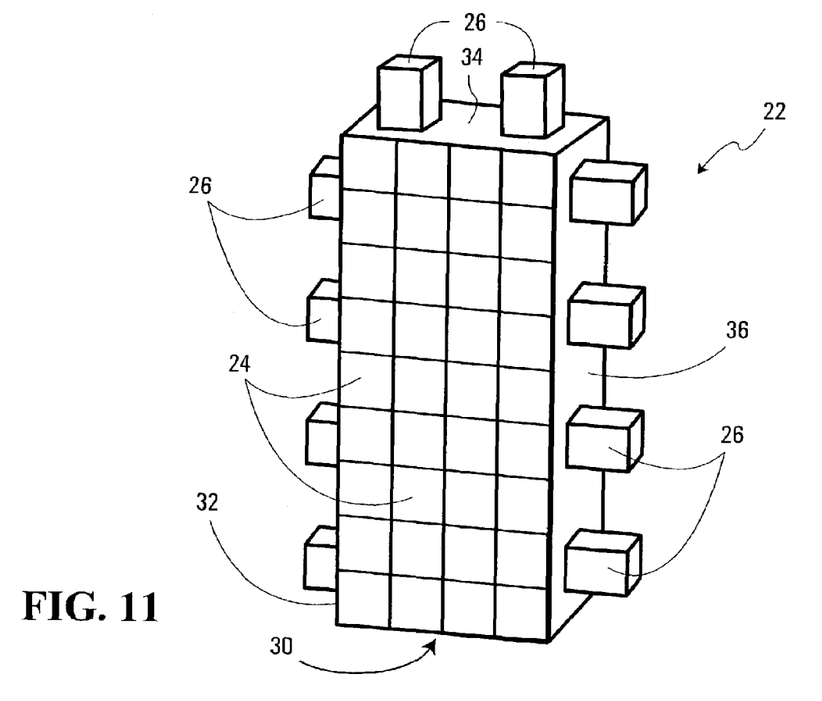
FIG. 11 is a front perspective view of a discrete processing module, according to yet another variant example of implementation of the present invention.

In yet another variant example of implementation, during manufacturing of the functional modules 22, a plurality of designated functional sub-modules 26 are distributed at the periphery of the body 24, as shown in FIG. 11. This distribution of functional sub-modules 26 realizes a local cooling system for the functional module 22, each designated functional sub-module 26 forming a cooling fin operative to transmit heat, either generated by the functional module 22 or received from the body 12, into the ambient environment. These local cooling fins of functional modules 22 serve to increase the total heat dissipation for the wafer 10. In a specific example, the designated functional sub-modules 26 which form cooling fins on each functional module 22 are semiconductor chips mounted to the side surfaces 32, 34 and 36 of body 24, each semiconductor chip implementing a dynamic random access memory (DRAM) of the functional module 22.

In a further variant example of implementation, the microelectronic complex is formed on a substrate of dielectric material, such as a circuit board, including a planar surface. A plurality of discrete functional modules are affixed to the planar surface of the substrate at attachment sites, as described above with regard to the semiconductor wafer. The substrate may contain a plurality of electronic components, such as chips and/or integrated circuits, to which the discrete functional modules connect directly via interconnection modules. Alternatively, the substrate may contain only connections to chips and/or integrated circuits that are realized on a remote body, such that the functional modules are indirectly connected to the chips and/or integrated circuits via the substrate.

Although several embodiments have been illustrated, this was for the purpose of describing, but not limiting, the invention. Various modifications will become apparent to those skilled in the art and are within the scope of this invention, which is defined more particularly by the attached claims.

What is claimed is:

1. A microelectronic complex comprising:
 a) a first body including a planar main surface, said planar main surface defining an attachment site;
 b) a discrete functional module including a second body containing an integrated circuit, said second body including a pair of main faces and a side surface between said pair of main faces, said discrete functional module being affixed to said first body at said attachment site whereby said first and second bodies are maintained in a predetermined spatial relationship in which the side surface of said second body faces the planar main surface of said first body wherein one of the main faces of said second body forms an acute angle with the planar main surface of said first body;
 c) an interconnection module allowing to transport signals between said first body and the integrated circuit of said second body.

2. A microelectronic complex comprising:
 a) a first body including a planar main surface, said planar main surface defining an attachment site;
 b) a discrete functional module including a second body containing an integrated circuit, said second body including a pair of main faces and a side surface between said pair of main faces, said discrete functional module being affixed to said first body at said attachment site whereby said first and second bodies are maintained in a predetermined spatial relationship in which the side surface of said second body faces the planar main surface of said first body;
 c) an interconnection module allowing to transport signals between said first body and the integrated circuit of said second body, wherein said interconnection module includes a plurality of signal transmissive paths, said discrete functional module including a plurality of contact pads on said second body for receiving the signal transmissive paths of said interconnection module, said contact pads allowing signals to be exchanged between the integrated circuit of said second body and said first body via the signal conducting members.

3. A microelectronic complex as defined in claim 2, wherein the side surface of said second body is in contact with the main surface of said first body at said attachment site.

4. A microelectronic complex as defined in claim 2, wherein each of the main faces of said second body forms a substantially right angle with the planar main surface of said first body.

5. A microelectronic complex as defined in claim 2, wherein the surface area of the side surface of said second body is less then 900 mm$^2$.

6. A microelectronic complex as defined in claim 2, wherein said discrete functional module is solder anchored to the planar main surface of said first body.

7. A microelectronic complex as defined in claim 2, wherein said discrete functional module is affixed to the planar main surface of said first body using conductive thermoset.

8. A microelectronic complex as defined in claim 2, wherein said discrete functional module is affixed to the planar main surface of said first body using a mechanical attachment device.

9. A microelectronic complex as defined in claim 2, wherein a plurality of said discrete functional modules are arranged on said first body.

10. A microelectronic complex as defined in claim 9, wherein the arrangement of said plurality of discrete functional modules on said first body realizes a cooling system for said microelectronic complex.

11. A microelectronic complex as defined in claim 2, wherein said second body is formed of a heat-conductive material.

12. A microelectronic complex as defined in claim 2, wherein said second body is a dielectric substrate containing a plurality of semiconductor chips.

13. A microelectronic complex as defined in claim 2, wherein said first body is a circuit board.

14. A microelectronic complex as defined in claim 2, wherein said first body is a semiconductor wafer.

15. A microelectronic complex comprising:
 a) a first body including a planar main surface, said planar main surface defining an attachment site;
 b) a plurality of discrete functional modules arranged on said first body, each discrete functional module including a second body containing an integrated circuit, said second body including a pair of main faces and a side surface between said pair of main faces, said plurality of discrete functional modules being affixed to said first body at said attachment site whereby said second bodies are maintained in a predetermined spatial relationship with said first body in which the side surfaces of said second bodies face the planar main surface of said first body, the arrangement of said plurality of discrete functional modules on said first body realizes a cooling system for said microelectronic complex, wherein said cooling system includes a plurality of cooling fins for dissipating heat generated by said microelectronic complex, each cooling fin realized by one of said discrete functional modules;

c) an interconnection module allowing to transport signals between said first body and the integrated circuits of said second bodies.

* * * * *